United States Patent [19]

Tayakin et al.

[11] 4,034,238

[45] July 5, 1977

[54] FIELD EFFECT TRANSISTOR INFORMATION TRANSFER CIRCUIT FOR USE IN STORAGE REGISTER

[76] Inventors: Jury Vasilievich Tayakin, ulitsa Scherbakova, 98v, kv. 109; Vladimir Pavlovich Sidorenko, ulitsa Scherbakova, 92v, kv. 29; Alexandr Yakovlevich Sirota, ulitsa Scherbakova, 74b, kv. 81; Jury Vladimirovich Prokofiev, ulitsa Scherbakova, 73, kv. 131; Alexandr Maximovich Kopytov, ulitsa Karpinskogo, 3, all of Kiev, U.S.S.R.

[22] Filed: Nov. 24, 1975

[21] Appl. No.: 634,528

[30] Foreign Application Priority Data

Nov. 29, 1974 U.S.S.R. .............................. 2075539

[52] U.S. Cl. ............................ 307/221 C; 307/251; 307/279
[51] Int. Cl.² ...................................... G11C 19/28
[58] Field of Search ............... 307/221 C, 279, 251, 307/205

[56] References Cited

UNITED STATES PATENTS

| 3,506,851 | 4/1970 | Polkinghorn et al. | 307/251 |
| 3,514,765 | 5/1970 | Christensen | 307/279 X |
| 3,648,065 | 3/1972 | Hoffman | 307/221 C |

OTHER PUBLICATIONS

IBM Tech. Bul. vol. 17, No. 7 12/1974, p. 1989, "Dynamic Logic Driver," by Long et al.

*Primary Examiner*—John S. Heyman
*Attorney, Agent, or Firm*—Lackenbach, Lilling & Siegel

[57] ABSTRACT

An output device of a metal-insulator-semiconductor transistor integrated circuit comprises, according to the invention, a penultimate stage, an output transistor, a clock pulse terminal and a separation pulse terminal. The penultimate stage incorporates a first transistor for charging the gate capacitance of the output transistor, a second transistor for discharging the gate capacitance of the output transistor, and a repeater whose input serves as an input of the output device, the output is connected to the drain of the first transistor, and the terminal for gating information from the output of the repeater is connected to the clock pulse terminal. The device of the invention makes it possible to reduce power consumption, cut production costs and decrease the size of electronic computers wherein it is used.

1 Claim, 10 Drawing Figures

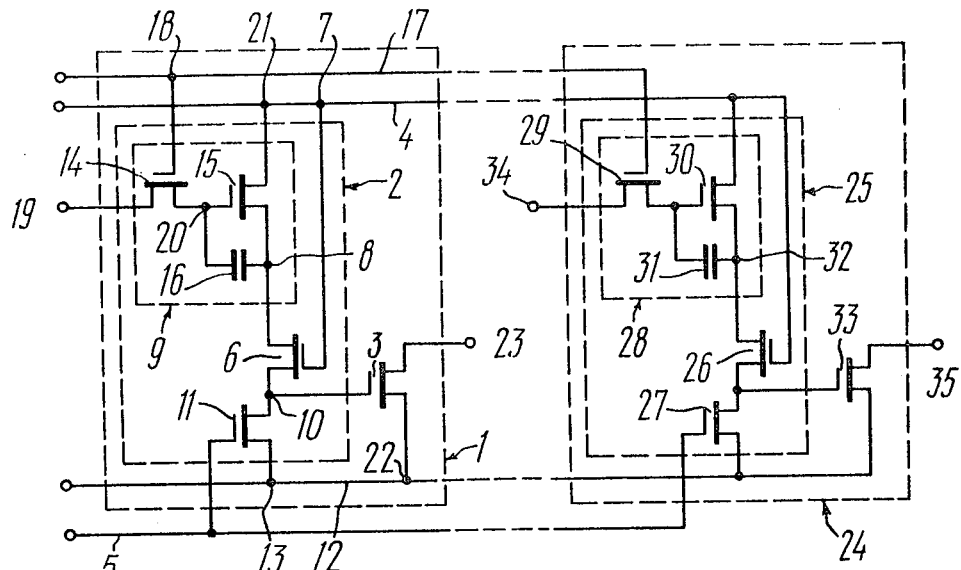
FIG. 1
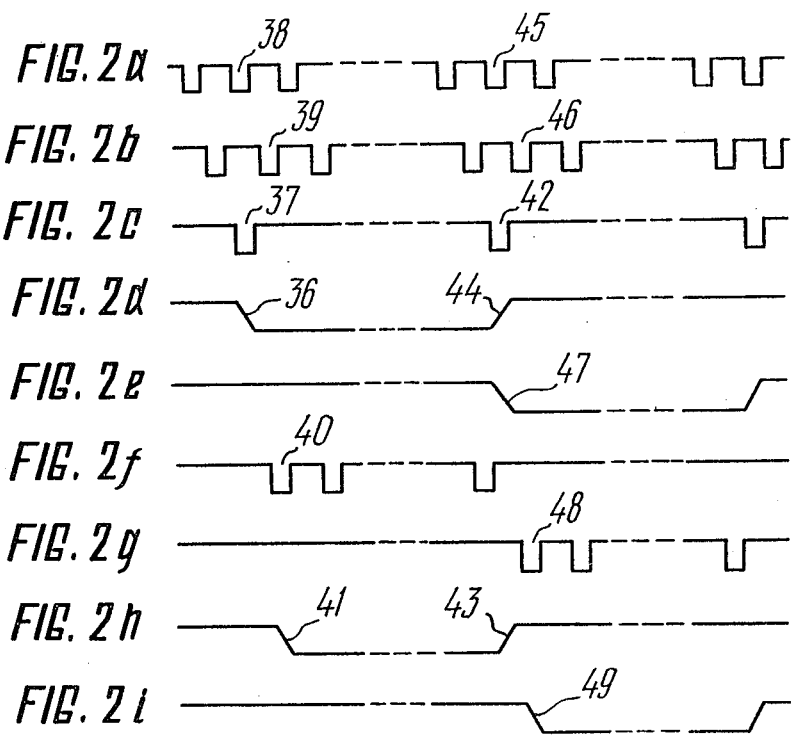
FIG. 2a
FIG. 2b
FIG. 2c
FIG. 2d
FIG. 2e
FIG. 2f
FIG. 2g
FIG. 2h
FIG. 2i

FIELD EFFECT TRANSISTOR INFORMATION TRANSFER CIRCUIT FOR USE IN STORAGE REGISTER

The invention relates to pulse technology, and more particularly, to output devices of integrated circuits employing metal-insulator-semiconductor transistors that provide for transfer of information to registers involving time separation of character digits.

The invention can be applied to electronic computers and other digital instruments employing integrated circuits.

At present, the problem of reducing power supply, production costs and size calls for an urgent solution in developing smallsize electronic computers with off-line power supply employing integrated circuits with metal-insulator-semiconductor transistors. Since a substantial share of power supplied to the metal-insulator-semiconductor transistor integrated circuit is consumed by the output devices it becomes important to cut down the power consumption of the output devices of metal-insulator-semiconductor transistor integrated circuit. Besides, in order to reduce the cost and size of electronic computers by simplifying their peripheral devices, it is essential that the pulses for sensing character digits of the register be generated in the metal-insulator-semiconductor transistor integrated circuit.

Known in the art is an output device of metal-insulator-semiconductor transistor integrated circuit that can be used for transferring information from the integrated circuit to the register. The output device consists of a penultimate stage and an output transistor and contains a clock pulse terminal. The penultimate device incorporates a first transistor used to charge the gate capacitance of the output transistor, a second transistor for its discharging, with the resistance of the second transistor being much lower than that of the first transistor. The penultimate stage contains also an insulating transistor used to store information on the gate capacitance of the output transistor within the intervals between clock pulses. The gate of the insulating transistor and the drain of the first transistor are connected to the clock pulse line, the drain of the insulating transistor is connected to the source of the first transistor and to the drain of the second transistor, while the source of the insulating transistor is connected to the gate of the output transistor. The gate of the second transistor serves as an input of the output device of the metal-insulator-semiconductor transistor integrated circuit with the drain of the output transistor serving as the output.

If during the clock pulse action a voltage at a logical I is applied to the input of the output device, all transistors of the penultimate stage are turned on. The gate capacitance of the output transistor is discharged through the insulating and the second transistors to a low voltage level determined by the ratio between the resistances of the voltage divider formed by the first and the second transistors. The output transistor is turned off and the output is disconnected from the common line. At a logical 0 on the input of the output device the second transistor is off and the gate capacitance of the output transistor is charged through the first and the insulating transistors during the clock pulse action. The output transistor is turned on and the output of the output device is connected to the common line through the low resistance of the on output transistor.

In the intervals between clock pulses the insulating transistor is off providing no ways for recharging the gate capacitance of the output transistor, the gate capacitance of the output transistor remaining charged or discharged and maintaining the output transistor in on or off positions, respectively.

The known output device consumes a considerable amount of power due to the voltage divider employed therein to provide a low voltage level on the gate of the output transistor since such a voltage divider consumes much more power than that needed for recharging the inner capacitances of the output device.

When employing the known output device in the metal-insulator-semiconductor transistor integrated circuit both as output devices for transferring the character digit code from the integrated circuit to the register, and as output devices for transferring the signal for gating character digits from the integrated circuit to the register, the overlapping of signal leading edges of the adjacent character digits is observed. This is due to the fact that the turning on and the turning off of the output transistors occurs at one and the same time, i.e. during clock pulse action. Therefore, when utilizing such output devices in electronic computers, it is necessary to have special devices for eliminating interferences in the register.

It is an object of the present invention to eliminate the above-mentioned disadvantages.

A further object of the present invention is to reduce power consumed by the output devices in the metal-insulator-semiconductor transistor integrated circuit.

Still another object of the present invention is to eliminate the overlapping of the signal leading edges of the adjacent character digits which makes it possible to eliminate from the electronic computer special devices used for getting rid of the interferences that occur with the overlapping of leading edges.

According to the present invention, there is provided in the output device of the metal-insulator-semiconductor transistor integrated circuit used for the transfer of information to the register involving time separation of character digits, comprising a penultimate stage, an output transistor which gate is connected to the output of the penultimate stage, and the drain is connected to the output of the output device and the source is connected to the common line and a clock pulse line, with the penultimate stage incorporating a first transistor and a second transistor to discharge the gate capacitance of the output transistor used to charge the gate capacitance of the output transistor while the gate of the first transistor is connected to the clock pulse line, and its source is connected to the output of the penultimate stage, the penultimate stage having a follower whose input is the input of the output device in the metal-insulator-semiconductor transistor integrated circuit, the output of the follower being connected to the drain of the first transistor while the output for gating information from the follower output is connected to the clock pulse line; in addition, it incorporates a separation pulse line which is connected to the gate of the second transistor of the penultimate stage, its drain being connected to the output of the penultimate stage and the source to the common line.

The present invention will now be described with reference to a preferred embodiment thereof in conjunction with the accompanying drawings in which:

FIG. 1 is a system of output devices of the metal-insulator-semiconductor transistor integrated circuit, according to the invention;

FIG. 2a, 2b, 2c, 2d, 2e, 2f, 2g, 2h, 2i are time voltage plots illustrating the operation of the system of output devices in the metal-insulator-semiconductor transistor integrated circuit, according to the invention.

An output device 1 (FIG. 1) of a metal-insulator-semiconductor transistor integrated circuit comprises a penultimate stage 2, an output transistor 3, a clock pulse line 4, and a separation pulse line 5.

The penultimate stage 2 comprises a first transistor 6 whose gate is connected to the clock pulse line 4 at a junction point 7, its drain being connected to an output 8 of a follower 9. The source of the first transistor 6 is connected to an output 10 of the penultimate stage 2 connected to which are also the drain of a second transistor 11 and the gate of the output transistor 3. The source of the second transistor 11 is connected to a common line 12 at a junction point 13, while its gate is connected to the separation pulse line 5. The follower 9 comprises transistors 14 and 15 and a capacitor 16. The gate of the transistor 14 is connected to an additional clock pulse line 17 at a junction point 18. The drain of the transistor 14 is connected to an input 19 of the output device 1 of the metal-insulator-semiconductor transistor integrated circuit. The source of the transistor 14 is connected to the gate of the transistor 15 and the capacitor 16 at a junction point 20. The source of the transistor 15 and the capacitor 16 is connected to the output 8 of the follower 9. The drain of the transistor 15 is connected to a terminal 21 for gating information from the output 8 of the follower 9, which is connected to the clock pulse line 4. The source of the output transistor 3 is connected to the common line 12 at a junction point 22. The drain of the output transistor 3 is connected to an output 23 of the output device 1 of the metal-insulator-semiconductor transistor integrated circuit.

Represented in FIG. 1 is one more output device 24 of the metal-insulator-semiconductor transistor integrated circuit taken from the system of output devices in the metal-insulator-semiconductor transistor integrated circuit.

The output device 24 of the metal-insulator-semiconductor transistor integrated circuit is similarly constructed and comprises a penultimate stage 25 with a first transistor 26, a second transistor 27 and a follower 28. The follower 28 employs transistors 29 and 30 and a capacitor 31 and incorporates output 32. The output device 24 of the metal-insulator-semiconductor transistor integrated circuit also comprises an output transistor 33 and has an input 34 and an output 35. The clock pulse line 4, additional clock pulse line 17, separation pulse line 5 and common line 12 are common for all output devices in the metal-insulator-semiconductor transistor integrated circuit involved in the system of output devices of the metal-insulator-semiconductor transistor integrated circuit.

Illustrated in FIG. 2a is a time plot of clock pulses supplied to the additional clock pulse line 17 (FIG. 1).

Represented in FIG. 2b is time plot of clock pulses supplied to the clock pulse line 4 (FIG. 1).

Illustrated in FIG. 2c is a time plot of separation pulses supplied to the separation pulse line 5 (FIG. 1).

Represented in FIG. 2d is a time plot of voltages across the input 19 (FIG. 1) of the output device 1 of the metal-insulator-semiconductor transistor integrated circuit.

Shown in FIG. 2e is a time plot of voltages across the input 34 (FIG. 1) of the output device 24 of the metal-insulator-semiconductor transistor integrated circuit.

Illustrated in FIG. 2f is a time plot of pulses generated at the output 8 (FIG. 1) of the follower 9.

Represented in FIG. 2g is a time plot of pulses generated at the output 32 (FIG. 1) of the follower 28.

Shown in FIG. 2h is a time plot of voltages at the gate of the output transistor 3 (FIG. 1).

Represented in FIG. 2i is a time plot of voltages at the gate of the output transistor 33.

The proposed output device 1 or 24 of the metal-insulator-semiconductor transistor integrated circuit can be constructed employing metal-insulator-semiconductor transistors either with n-channel enhancement or with p-channel enhancement. Described here is the operation of the output devices 1 and 24 of the metal-insulator-semiconductor transistor integrated circuit employing p-channel enhancement transistors, when making use of n-channel enhancement transistors the polarity of all pulses would have to be reversed.

The output device 1 of fthe metal-insulator-semiconductor transistor integrated circuit functions as follows. Concurrently with issuing an input signal corresponding to the information of the new character digit — Section 36 (FIG. 2d) — to the input 19 of the output device 1 in the metal-insulator-semiconductor transistor integrated circuit, a separation pulse 37 (FIG. 2c) coinciding in time with a clock pulse 38 (FIG. 2a) is supplied to the separation pulse line 5 (FIG. 1). The second transistor 11 (FIG. 1) is driven into conduction during the action of the separation pulse 37 (FIG. 2c) and the gate of the output transistor 3 (FIG. 1) during this time is connected to the common line 12 through the conducting second transistor 11. The output transistor 3 during this time interval will be non-conducting irrespective of the type of input information. When logical 1 corresponding to the section 36 (FIG. 2d) arrives at the input 19, the input signal is supplied to the gate of the transistor 15 to the transistor 14 rendered conducting by the clock pulse 38 (FIG. 2a). Since there are no clock pulses at the clock pulse line 4, the clock pulse line 4 has a potential of the common line 12, the transistor 15 is driven into conduction, and the capacitor 16 is charged through the transistors 14 and 15. Upon the termination of the clock pulse 38 (FIG. 2a) the transistor 14 (FIG. 1) rendered non-conducting and the capacitor 16 remains charged, keeping the transistor 15 in the conducting state. A clock pulse 39 (FIG. 2b) supplied to the clock pulse line 4 (FIG. 1) passes through the transistor 15 to the output 8 of the follower 9 — pulse 40 (FIG. 2f) — and through the first transistor 6 (FIG. 1) rendered non-conducting by the clock pulse 39 (FIG. 2b) charges the gate capacitance of the output transistor 3 — section 41 (FIG. 2h). The output transistor 3 (FIG. 1) is driven into conduction and subsequently maintained in "on" state by the voltage of the charged gate capacitance of the output transistor 3 until a separation pulse 42 (FIG. 2c) arrives and drives into conduction the second transistor 11 (FIG. 1). In this case the gate capacitance of the output transistor 3 is discharged through the second transistor 11 to the common line 12 which corresponds to section 43 (FIG. 2h), and the output transistor is rendered non-conducting. Concurrently with the separation pulse 42 (FIG. 2c) arriving at the separation pulse line 5, a new input signal corresponding to the information of the next character digit is supplied to the input 19 (FIG. 1). If, in this case, voltage at logical 0 is set at the input 19 which corresponds to section 44 (FIG. 2d), the gate capacitance of the transistor 15 and capacitor 16 are discharged towards the end of action of a clock pulse 45 (FIG. 2a) coinciding in time with the separation pulse 42 (FIG. 2c). In this case the transistor 15 (FIG. 1) is rendered non-conducting and remains in this state until a signal at logical 1 arrives at the input 19. Therefore, a pulse 46 (FIG. 2b) does not get to the output 8 of the follower 9, the gate capacitance of the output transistor 3 is not charged, and it remains non-conducting.

If during the action of the clock pulse 45 (FIG. 2a) a signal is issued at logical 1 to the input 34 (FIG. 1) of the output device 24 of the metal-insulator-semiconductor transistor integrated circuit, the gate capacitance of the transistors 30 and 31 will be charged. The transistor 30 is driven into conduction, and the clock pulse 46 (FIG. 2b) that has been later supplied to the clock pulse line 4 will pass through the transistor 30, and a pulse 48 (FIG. 2g) will be generated at the output 32 of the follower 28. This pulse through the transistor 26 driven into conduction by the clock pulse 46 (FIG. 2b) will charge the gate capacitance of the output transistor 33 — section 49 (FIG. 2i) — and it is driven into conduction. And while the turning-off of the one output transistor 3 (FIG. 1) of the output device in the metal-insulator-semiconductor transistor integrated circuit which corresponds to section 43 (FIG. 2h), coincides in time with the separation pulse 42 (FIG. 2c), the turning-on of the output transistor 33 (FIG. 1) of the output device 24 in the metal-insulator-semiconductor transistor integrated circuit coincides in time with the clock pulse 46 (FIG. 2b)

Thus, the utilization of separation pulses and the utilisation of the follower for the unconditional discharge of the gate capacitances of the output transistors 3 and 33 (FIG. 1) of the output devices 1 and 24 in the metal-insulation-semiconductor transistor integrated circuit has made it possible to separate in time the turning-on and turning-off of the output transistors 3 and 33. Therefore, when utilizing the output devices 1 and 24 of the metal-insulator-semiconductor transistor integrated circuit for transferring both the character digit codes and the signals for gating character digits from the integrated circuit to the register, the overlapping of the trailing edges of code pulses of each character digit with leading edge pulse for gating the next character digit is eliminated as well as the overlapping of the trailing edge of each pulse for gating the character digit with the leading edges of code pulses of the next character digit, thereby eliminating the information transferred to the given character digit from getting into the previous or the following character digits.

The separation in time of the separation and clock pulses eliminates the ways of current flowing in the proposed embodiment and makes it possible to reduce substantially the power consumed by the output device in the metal-insulator-semiconductor transistor integrated circuit.

What is claimed is:

1. An output device of a metal-insulator-semiconductor transistor integrated circuit providing the transfer of information to the register involving time separation of character digits and comprising:
   a. a penultimate stage and an output of said penultimate stage;
   b. an output transistor, having a gate, a drain and a source, said gate of said output transistor being connected to said output of said penultimate stage, said drain of said output transistor being connected to the output of the output device;
   c. a clock pulse line;
   d. a separation pulse line;
   e. a first transistor of said penultimate stage, provided to charge the gate capacitance of said output transistor, and having a gate, a drain and a source, said gate of said first transistor being connected to said clock pulse line; said source of said first transistor being connected to said output of said penultimate stage;
   f. a second transistor of said penultimate stage provided to discharge the input capacitance of the gate of said output transistor and having a gate, a drain and a source, said gate of said second transistor being connected to said separation pulse line; said drain of said second transistor being connected to said output of the penultimate stage;
   g. a follower of said penultimate stage; an input and an output of said follower; a terminal for gating information from said output of said follower; said input of said follower being an input of said output device of the metal-insulator-semiconductor transistor integrated circuit, said output of said follower being connected to said drain of said first transistor, said terminal for gating information from said output of said follower being connected to said clock pulse line; and
   h. a common line; said source of said second transistor and said source of said output transistor being connected to said common line.

* * * * *

UNITED STATES PATENT OFFICE
CERTIFICATE OF CORRECTION

PATENT NO. : 4,034,238
DATED : July 5, 1977
INVENTOR(S) : Jury Vasilievich Tayakin, et al.

It is certified that error appears in the above-identified patent and that said Letters Patent are hereby corrected as shown below:

Column 1, line 34, delete "terminal" and replace with --line--;

Column 2, lines 50-51, delete "and a second transistor to discharge the gate capacitance of the output transistor"; and Column 2, line 55, after "stage," add --and a second transistor to discharge the gate capacitance of the output transistor,--.

Signed and Sealed this

Twenty-ninth Day of November 1977

[SEAL]

Attest:

RUTH C. MASON
Attesting Officer

LUTRELLE F. PARKER
Acting Commissioner of Patents and Trademarks